(12) United States Patent
Slovikosky

(10) Patent No.: US 6,422,304 B1
(45) Date of Patent: Jul. 23, 2002

(54) SYSTEM AND METHOD FOR COOLING A CENTRAL PROCESSING UNIT

(76) Inventor: Shari Lynn Slovikosky, 11294 Stones Throw Dr., Reston, VA (US) 20194

( * ) Notice: Subject to any disclaimer, the term of this patent is extended or adjusted under 35 U.S.C. 154(b) by 0 days.

(21) Appl. No.: 09/634,463

(22) Filed: Aug. 7, 2000

(51) Int. Cl.[7] .................................................. F28F 7/00
(52) U.S. Cl. ..................... 165/80.4; 165/80.5; 165/185; 165/104.33; 174/15.1; 257/714; 361/698; 361/696
(58) Field of Search ................................ 165/80.4, 80.3, 165/80.5, 104.33, 104.34, 185; 361/677, 689, 698, 699, 696; 174/15.1; 257/714

(56) References Cited

U.S. PATENT DOCUMENTS

| | | | | |
|---|---|---|---|---|
| 1,973,981 A | * | 9/1934 | Hall | |
| 2,047,465 A | * | 7/1936 | Ford | |
| 2,187,011 A | * | 1/1940 | Braden | |
| 3,473,603 A | * | 10/1969 | Fujie | |
| 4,546,619 A | * | 10/1985 | Rohner | |
| 4,867,231 A | * | 9/1989 | Bottum | |
| 4,987,953 A | * | 1/1991 | Hedstrom | 165/80.4 |
| 5,285,347 A | * | 2/1994 | Fox et al. | |
| 5,323,847 A | * | 6/1994 | Koizumi et al. | |
| 5,471,850 A | * | 12/1995 | Cowans | 165/80.4 |
| 5,646,824 A | * | 7/1997 | Ohashi et al. | 174/15.1 |
| 5,706,668 A | * | 1/1998 | Hilpert | |
| 5,731,954 A | * | 3/1998 | Cheon | 361/699 |
| 5,925,929 A | * | 7/1999 | Kuwahara et al. | |
| 5,940,270 A | * | 8/1999 | Puckett | |
| 6,029,742 A | * | 2/2000 | Burward-Hoy | 165/80.4 |
| 6,166,907 A | * | 12/2000 | Chien | 361/699 |
| 6,234,240 B1 | * | 5/2001 | Cheon | 165/80.3 |

* cited by examiner

Primary Examiner—Ira S. Lazarus
Assistant Examiner—Terrell McKinnon

(57) ABSTRACT

An auxiliary cooling system for cooling a central processing unit (CPU) of a computer. The system includes an inner tube provided within an outer tube. A first end of the outer tube is attached to a fan and a second end of the outer tube is attached to a housing of a computer adjacent the CPU. Inlet and outlet tubes are attached to a first end and second end of the inner tube. A pump draws a cooling fluid from a cooling source and passes the cooling fluid to the inner tube. As the cooling fluid passes through the inner tube, the temperature of the air within the outer tube is decreased. A fan is used to direct the cool air onto the CPU.

12 Claims, 2 Drawing Sheets

SYSTEM AND METHOD FOR COOLING A CENTRAL PROCESSING UNIT

FIELD OF THE INVENTION

The invention relates to a system and method for cooling a central processing unit. More particularly, the invention relates to a system and method including a fan that directs fluid-cooled air onto a central processing unit for reducing an operating temperature of the central processing unit.

BACKGROUND OF THE INVENTION

Electrical components operate efficiently up to a certain operating temperature. Thus, the operating temperature of electrical components, particularly of a computer, typically are monitored and controlled. Manufacturers of electrical components typically provide a recommended maximum operating temperature for an electrical component. If a recommended maximum operating temperature is exceeded, the electrical component may overheat and cause damage to the component or cause the component to fail.

Systems for cooling electrical components, for example, a central processing unit (CPU) of a computer are known. Such systems typically use a fan that directs ambient air over a CPU. The fan may be mounted adjacent the CPU and attached to a housing enclosing the CPU. The fan may be used to direct air outside of the housing over the CPU to reduce an operating temperature of the CPU.

Systems using only a fan, however, may not reduce a CPU operating temperature sufficiently. Even if a fan reduces the operating temperature of a CPU (or other electrical component) to a point where it will avoid damage or failure, further cooling may provide enhanced performance due to a lower operating temperature. Thus, although existing cooling systems may reduce an operating temperature of a CPU, various drawbacks exist with ambient air fan cooling systems.

SUMMARY OF THE INVENTION

An object of the invention is to overcome these and other drawbacks of existing systems.

Another object of the invention is to provide an improved system and method for cooling a central processing unit of a computer.

Another object of the invention is to provide a system and method for cooling a central processing unit of a computer to a level that increases performances compared with an ambient air fan cooling system.

Another object of the invention is to provide a system and method for cooling a central processing unit of a computer that uses a fan to direct liquid-cooled air onto the central processing unit.

These and other objects of the invention are accomplished according to various embodiments of the invention.

According to one embodiment, a system and method for cooling a central processing unit (CPU) of a computer are provided. The system uses a cooling fluid to cool ambient air that is directed at a CPU to reduce an operating temperature of the CPU. According to one embodiment, the system includes a conduit (e.g., including an inner tube and an outer tube), a fan, and a pump. The CPU is preferably mounted within a housing. The inner tube is housed within the outer tube. A first end of the outer tube is attached to an exhaust side of the fan. A second end of the outer tube is mounted to the housing adjacent the CPU. The inner tube has a first end and a second end. An inlet tube is attached to the inner tube first end and an outlet tube is attached to the inner tube second end. The inlet tube enables a cooling fluid to enter and pass through the inner tube. The cooling fluid has a temperature lower than a temperature of air within the outer tube. The outlet tube receives the cooling fluid from the inner tube. As the cooling fluid passes through the inner tube, the temperature of the cooling fluid causes the air temperature within the outer tube to decrease. The fan may then be used to direct the fluid-cooled air within the outer tube onto the CPU.

Prior to passing the cooling fluid through the inner tube, the temperature of the air within the outer tube may be substantially the same as the ambient air temperature. A pump may be used to pass the cooling fluid through the inner tube. When the cooling fluid is passed through the inner tube, however, the temperature of the cooling fluid causes the air within the outer tube to decrease, thus the air directed onto the CPU has a lower temperature than the ambient air. This causes the operating temperature of the CPU to decrease to a level lower than merely directing ambient air onto the CPU. This enables the performance of the CPU to increase and reduce the possibility of failure.

Various mounting embodiments may be used for attaching the outer tube to the housing. For example, the outer tube may be attached to a top, bottom or side portion of the housing. The outer tube may be retrofitted so that it may be attached to a computer housing expansion slot. Other mounting embodiments may also be used.

These and other objects of the invention will become apparent to one of ordinary skill in the art with reference to the figures and detailed description.

DETAILED DESCRIPTION OF PREFERRED EMBODIMENTS

Figure 1:
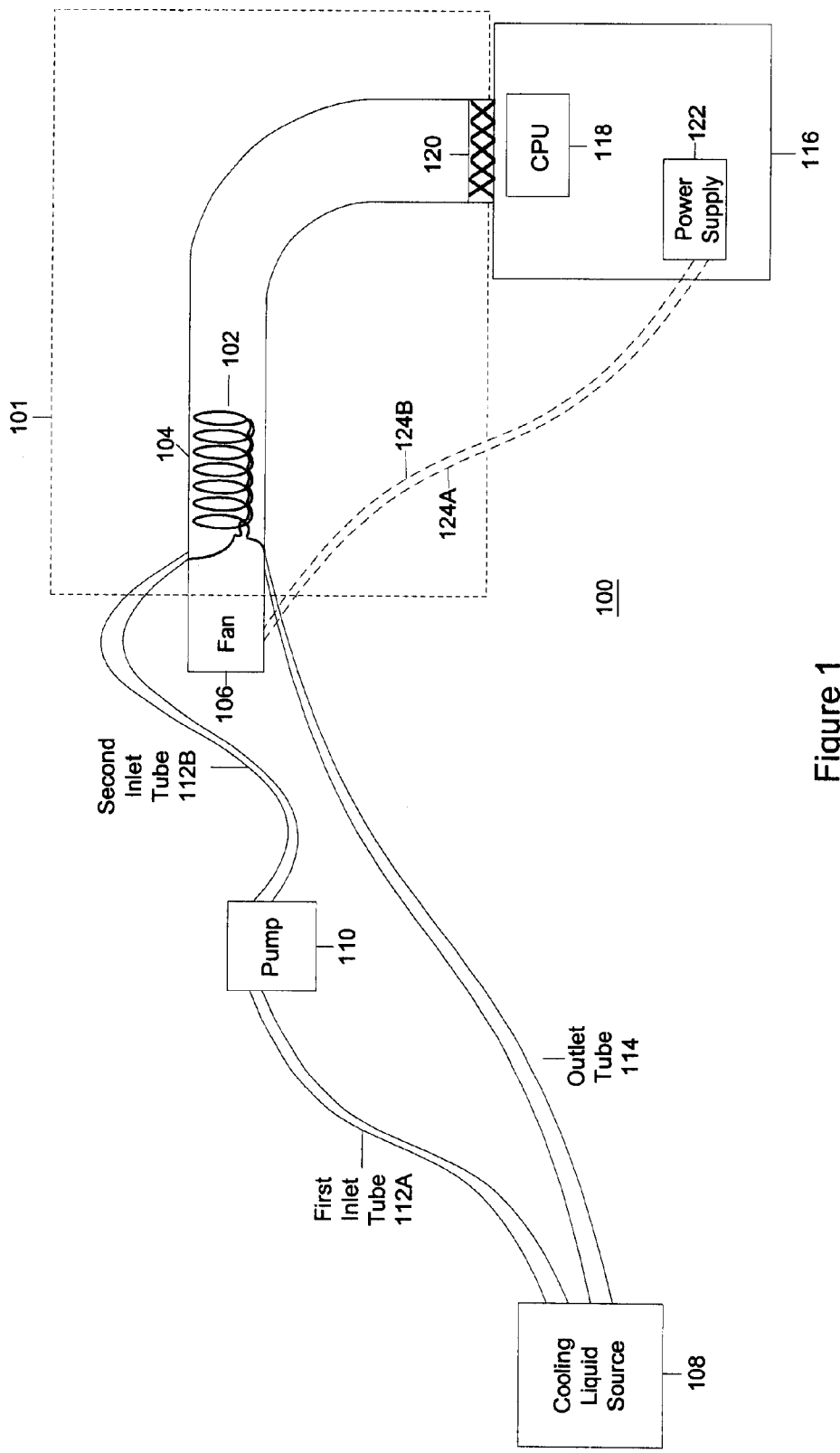
FIG. 1 is an illustration of an auxiliary cooling system in accordance with one embodiment of the invention.

According to one embodiment of the invention, an auxiliary cooling system 100 for 10 cooling a CPU of a computer is provided. As shown in FIG. 1, system 100 comprises a conduit 101 comprising an inner tube 102 and outer tube 104, fan 106, cooling fluid source 108, pump 110, first inlet tube 112A, second inlet tube 112B, and outlet tube 114. As shown, inner tube 102 is provided within outer tube 104. A first end of second inlet tube 112B is attached to a first end of inner tube 102. A second end of second inlet tube 112B is attached to a second end of pump 110. A first end of first inlet tube 112A is attached to a first end of pump 110. A second end of first inlet tube 112A is attached to cooling fluid source 108. A first end of outlet tube 114 is attached to a second end of inner tube 102. A second end of outlet tube 114 is attached to cooling fluid source 108.

According to one embodiment, the first end and second end of inner tube 102 are adjacent a first end of outlet tube 104. Preferably, first end of inner tube 102 enters outlet tube 104 adjacent the first end. Inner tube 102 extends substantially straight through a length of outer tube 104. When inner tube 102 approaches the second end of outer tube 104, inner tube 102 may be curved to provide a return portion that returns to the first end of outer tube 104. The return portion of inner tube 102 may be provided with a plurality of loops encircling a substantially straight portion of inner tube 102. The loops may encircle an entire length of the substantially straight portion of inner tube 102. Any number of loops may be provided, however, a range of seven (7) to fifteen (15) loops may be used according to one embodiment.

A first end of outer tube 104 may be attached to fan 106. Fan 106 may be attached using any known technique, for example, adhesive, metallic fasteners or other techniques. A second end of outer tube 104 may be attached to a housing 116 of a computer enclosing a CPU 118. The second end of outer tube 104 is preferably attached to housing 116 adjacent CPU 118. The second end of outer tube 104 may be attached to housing 116 using any known technique. Preferably, the second end of outer tube 104 is attached to housing 116 such that air may be directed into the second end of housing 116 and onto CPU 118.

System 100 may be used to cool CPU 118 by passing a cooling fluid from cooling fluid source 108 through inner tube 102 and directing air within outer tube 104 onto CPU 118 using fan 106. Pump 110 may be used to pass cooling fluid from cooling fluid source 108 through inner tube 102. Fan 106 may be operated using a power supply 122 of a computer or other power supply. Leads 124A and 124B may be used to provide power from power supply 122 to fan 106. Fan 106 is preferably a heatsink-fan combination and pump 110 may be, for example, a Flotec™ Drill pump. Other fans, pumps, and power supplies, however, may also be used. It should also be noted that first and second inlet tubes 112A, 112B, and inner and outer tubes 102, 104 may be made of any known material, for example, copper, plastic, polyvinyl chloride, etc. According to one embodiment, inner tube 102 is made of copper, first and second inlet tubes 112A, 112B are made of plastic, and outer tube 104 is made of polyvinyl chloride.

According to one embodiment of the invention, fan 106 is attached to a power supply of a computer. After a computer is powered on, fan 106 operates to direct air through conduit 101 over inner tube 102 and within outer tube 104 onto CPU 118. Preferably, after (or before) the computer is powered on, pump 110 is turned on. Pump 110 operates to draw the cooling fluid from cooling fluid source 108 through first inlet tube 112A. The cooling fluid passes through first inlet tube 112A and pump 110 and into second inlet tube 112B. The cooling fluid then enters inner tube 102 through a first end. The cooling fluid passes through inner tube 102 and exits through a second end. The cooling fluid and then enters outlet tube 114. Outlet tube 114 may return the cooling fluid to cooling fluid source 108.

According to one embodiment of the invention, cooling fluid source 108 maintains a relatively constant temperature of cooling fluid (e.g., water) of approximately fifty (50) degrees Fahrenheit. A refrigeration system or other known technique may be used to maintain the temperature of the cooling fluid substantially constant. It should be noted, however, that other cooling fluids and temperatures may also be used. As the cooling fluid passes through inner tube 102, the temperature of the cooling fluid causes the air temperature within outer tube 104 to decrease. Thus, when air directed by fan 106 exits outer tube 104 and is directed onto CPU 118, the air is at a lower temperature than the ambient air temperature. Therefore, system 100 directs cooler air onto CPU 118. By directing cooler air onto CPU 118, an operating temperature of CPU 118 may be decreased. A lower operating temperature of a CPU may enable CPU 118 to perform better and reduce a risk of failure.

System 100 may also comprise a screen 120. Screen 120 may be used to prevent moisture from entering housing 116 and possibly affecting CPU 118. Screen 120 may be any type of moisture impermeable material that permits the passage of air.

Figure 2:
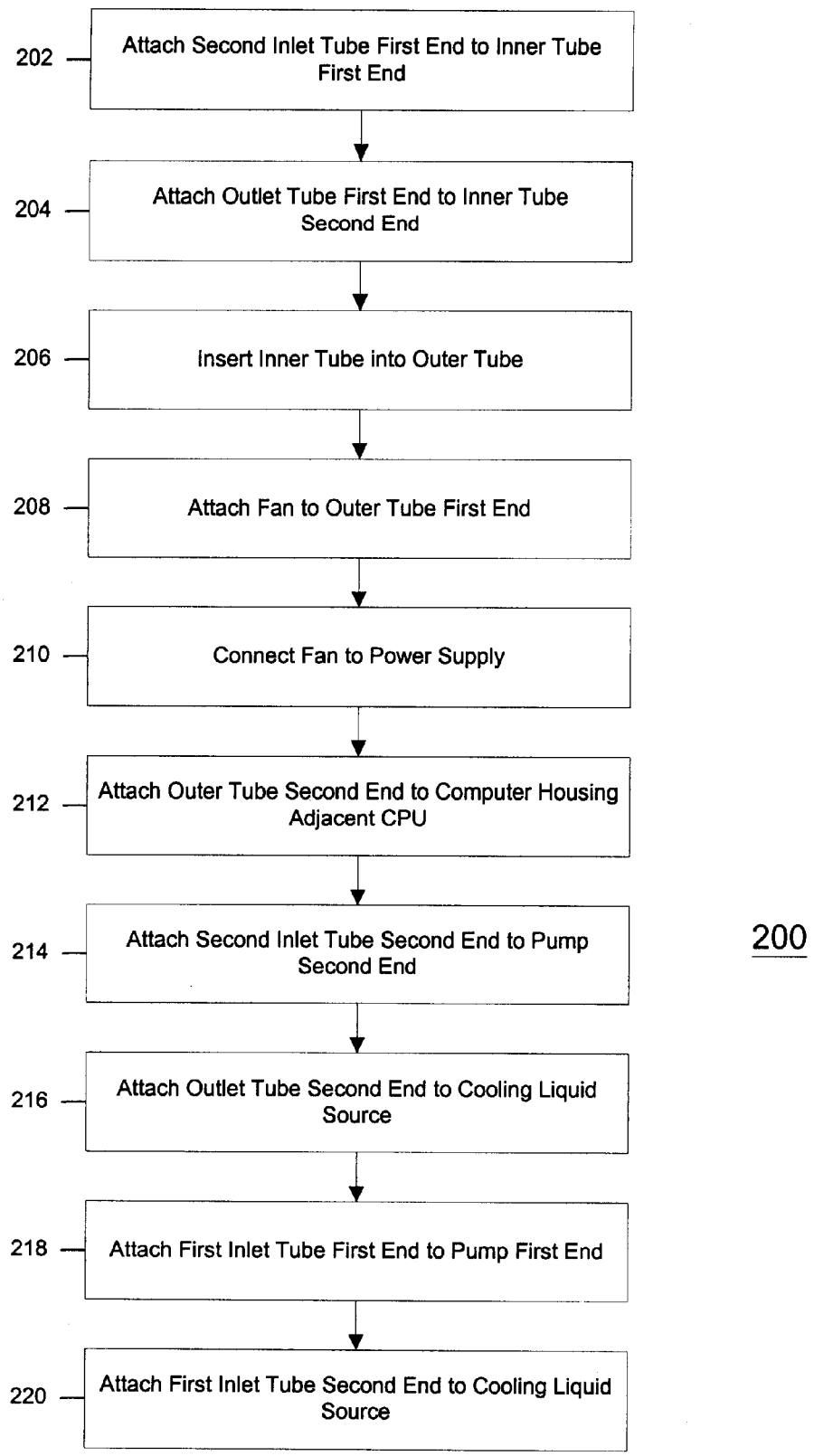
FIG. 2 is a block diagram of a method of providing an auxiliary cooling system for a CPU of a computer in accordance with one embodiment of the invention.

FIG. 2 illustrates a method 200 of providing an auxiliary cooling system for a CPU of a computer. According to method 200, a first end of second inlet tube 112B is attached to a first end of inner tube 102 in step 202. In step 204, a first end of outlet tube 114 is attached to a second end of inner tube 102. Inner tube 102 is then inserted into outer tube 104 in step 206. Fan 106 is attached to a first end of outer tube 104 in step 208. Fan 106 is then connected to a power supply in step 210. In step 212, a second end of outer tube 104 is attached to housing 116 adjacent CPU 118. In step 212, a second end of second inlet tube 112B is attached to a second end of pump 110. A second end of outlet tube 114 is attached to cooling fluid source 108 in step 216. A first end of first inlet tube 112A is attached to a first end of pump 110 in step 218. In step 220, a second end of first inlet tube 112A is attached to cooling fluid source 108.

Method 200 enables a cooling fluid to be passed through an inner tube 102 within an outer tube 104. The temperature of the air within outer tube 104 is decreased by the temperature of the cooling fluid. Fan 106 may then be used to direct the cooler air onto CPU 118. The cooler air reduces an operating temperature of CPU 118 to a temperature lower than that of an operating temperature of a CPU not having cooled air directed thereon.

According to one embodiment, the outer tube may be attached to the housing at various locations. For example, the outer tube may be attached to a top portion of the housing substantially directly above the CPU. This enables a large quantity of cooled air to be directed onto the CPU and significantly reduce the operating temperature of the CPU.

The outer tube may also be attached to a side portion of the housing substantially adjacent the CPU. This embodiment enables cooled air to be directed across the CPU. This embodiment may be preferable if, for example, mounting the outer tube to a top portion of the housing may interfere with the arrangement of other components (e.g., monitor).

Another embodiment includes a retrofit design enabling the cooling system to be used with various computer housings. The retrofit design utilizes an expansion slot provided in many computer housings. According to this embodiment, the outer tube includes an attachment that attaches the second end of the outer tube to a computer housing expansion slot. Any attachment that attaches to an expansion slot may be used. The expansion slot used is preferably substantially adjacent the CPU and/or enables cooled air to be directed onto the CPU.

Other mounting arrangements, for example, attaching the outer tube to a bottom portion of the housing substantially directly below the CPU may also be used. Choosing a mounting arrangement may depend on space availability (i.e., if the outer tube interferes with the location of other components) and desired reduction in CPU operating temperature. For example, an outer tube attached to a top portion of a housing substantially directly above the CPU with little or no obstructions between, may reduce the CPU operating temperature greater than with an outer tube attached to a bottom portion of the housing substantially directly below the CPU where a circuit board may be provided in between the outer tube and CPU because a greater amount of cooled air reaches the CPU.

Although the invention has been described in terms of cooling a CPU of a computer, it is to be understood that the invention is not limited to such an embodiment. For example, the invention may be used to cool any electrical or mechanical component. The scope of the invention is limited only by the claims pending hereto.

What is claimed is:

1. A system for cooling a central processing unit of a computer using a cooling fluid, the system comprising:
    a cooling fluid source comprising a cooling fluid;
    a first inlet tube having a first end and a second end, wherein the first end is attached to the cooling fluid source;
    a pump comprising an inlet portion and an outlet portion, wherein the second end of the first inlet tube is attached to the inlet portion of the pump;
    a second inlet tube having a first end and a second end, the first end of the second inlet tube being attached to the outlet portion of the pump, the second end of the second inlet tube being attached to a conduit, the conduit comprising an inner tube housed within an outer tube, outer tube having a first end and a second end and the inner tube comprising an inlet end and an outlet end;
    an outlet tube comprising a first end and a second end, the first end of the outlet tube being attached to the outlet end of the inner tube and the second end of the outlet tube being attached to the cooling fluid source; and
    a fan attached to the first end of the outer tube adjacent the second inlet tube, the second end of the outer tube attached to a computer housing, the computer housing enclosing a central processing unit, and wherein the outer tube is attached adjacent the central processing unit;
    wherein the pump operates to draw the cooling fluid from the cooling fluid source through the first inlet tube and pass the cooling fluid through the second inlet tube, the inner tube, and the outlet tube, and
        wherein a temperature of the cooling fluid is below a temperature of ambient air such that the temperature of the cooling fluid decreases a temperature of air within the outer tube, and
        wherein the fan directs the air within the outer tube onto the central processing unit to cool the central processing unit.

2. The system of claim 1, wherein the inner tube is made of copper.

3. The system of claim 1, wherein the outer tube is made of polyvinyl chloride.

4. The system of claim 1, wherein the cooling fluid is water.

5. The system of claim 1, wherein the fan is powered by a power supply of the central processing unit.

6. The system of claim 1, further comprising a moisture impermeable screen mounted adjacent the second end of the outer tube.

7. A method for cooling a central processing unit of a computer using a cooling fluid, the method comprising the steps of:
    attaching a second inlet tube first end to an inner tube first end;
    attaching an outlet tube first end to an inner tube second end;
    inserting an inner tube within an outer tube;
    attaching a fan to an outer tube first end;
    connecting the fan to a power supply;
    attaching an outer tube second end to a computer housing adjacent a central processing unit;
    attaching a second inlet tube second end to a pump second end;
    attaching an outlet tube second end to a cooling fluid source;
    attaching a first inlet tube first end to a pump first end; and
    attaching a first inlet tube second end to the cooling fluid source, wherein the fan directs air cooled by the cooling fluid source within the outer tube onto the central processing unit for cooling the central processing unit.

8. The method of claim 7, wherein the inner tube is made of copper.

9. The method of claim 7, wherein the outer tube is made of polyvinyl chloride.

10. The method of claim 7, wherein the cooling fluid is water.

11. The method of claim 7, wherein the fan is powered by a power supply of the central processing unit.

12. The method of claim 7, further comprising the step of attaching a moisture impermeable screen that permits the passage of air to the outer tube second end.

* * * * *